United States Patent
Bessho et al.

[11] Patent Number: 5,893,025
[45] Date of Patent: Apr. 6, 1999

[54] CATV CONVERTER FOR RECEIVING BOTH ANALOG AND DIGITAL SIGNALS

[75] Inventors: Masaki Bessho; Fumihiro Hamada, both of Nishikasugai-gun; Hitoshi Hirano, Haguri-gun, all of Japan

[73] Assignee: Matsushita Electric Industrial Co., Ltd., Osaka, Japan

[21] Appl. No.: 750,828

[22] PCT Filed: Apr. 15, 1996

[86] PCT No.: PCT/JP96/01032

§ 371 Date: Mar. 27, 1997

§ 102(e) Date: Mar. 27, 1997

[87] PCT Pub. No.: WO96/32814

PCT Pub. Date: Oct. 17, 1996

[30] Foreign Application Priority Data

Apr. 13, 1995 [JP] Japan .................................... 7-088119

[51] Int. Cl.$^6$ .............................. H04H 1/02; H04N 7/10; H03H 7/00
[52] U.S. Cl. ........................... 455/6.2; 333/174; 333/176; 348/10; 348/554; 348/726; 455/339; 455/266
[58] Field of Search .................................. 348/6, 10, 11, 348/553, 554, 725–728, 731, 908, 21; 455/6.1, 6.2, 339, 340, 266, 160.1, 168.1, 180.1, 188.1; 375/216; 333/174–176

[56] References Cited

U.S. PATENT DOCUMENTS

| | | | |
|---|---|---|---|
| 4,827,509 | 5/1989 | Izumiyama | 348/11 X |
| 5,159,711 | 10/1992 | Ma et al. | 333/176 X |
| 5,638,112 | 6/1997 | Bestler et al. | 348/10 |
| 5,748,262 | 5/1998 | Boie | 348/726 |

FOREIGN PATENT DOCUMENTS

| | | | |
|---|---|---|---|
| 7-15368 | 1/1995 | Japan | H04B 1/26 |
| 7-30824 | 1/1995 | Japan | H04N 5/44 |

OTHER PUBLICATIONS

International Search Report (w/translation).

*Primary Examiner*—Andrew I. Faile
*Assistant Examiner*—John W. Miller
*Attorney, Agent, or Firm*—Ratner & Prestia

[57] ABSTRACT

The present invention aims to provide a CATV converter which can receive both of analog and digital signals. The CATV converter comprises a second mixer (10) coupled with a first filter (13) which attenuates approximately equal frequency to an audio carrier of an upper adjacent channel and approximately equal frequency to a video carrier of a lower adjacent channel, a first amplifier (14) coupled with an output terminal of the first filter (13), and a second filter (15) coupled with the output terminal of the first amplifier (14). The second filter (15) attenuates a video carrier of the upper adjacent channel and an audio carrier of the lower adjacent channel. When an input signal is within a predetermined frequency range, the input signal fed to the input terminal (1) can short-circuit the input and output terminals of the second filter with a high frequency of the input signal.

3 Claims, 7 Drawing Sheets

CATV CONVERTER FOR RECEIVING BOTH ANALOG AND DIGITAL SIGNALS

FIELD OF THE INVENTION

The present invention relates to a CATV converter for digital and analog signals.

BACKGROUND OF THE INVENTION

A conventional CATV converter, as illustrated in FIG. 7, comprises:

(1) an input terminal 57A,
(2) a first local oscillator 51,
(3) a first mixer 52, where an input signal to the input terminal 57A is fed to a first terminal of the first mixer 52, and an output from the first local oscillator 51 is also fed to a second terminal thereof,
(4) an intermediate frequency filter 53 to which an output of the first mixer 52 is fed,
(5) a second local oscillator 54,
(6) a second mixer 55, where an output of the intermediate frequency filter 53 is fed to a first terminal of the second mixer 55, and an output of the second local oscillator 54 is also fed to a second terminal thereof,
(7) an output circuit 56 coupled with the output terminal of the second mixer 55, and
(8) an output terminal 57B coupled with an output terminal of the output circuit 56.

The output circuit 56 comprises the following elements coupled in series in this order: a first filter 58, a first amplifier 59, a second filter 60, and a second amplifier 61.

An operation of the above conventional CATV is explained here:

A signal fed into the input terminal 57A is mixed in the first mixer 52 whereby being converted to a first intermediate frequency. The output thereof is fed to the intermediate filter 53, and only an intermediate frequency bandwidth is tapped off. The output thereof is fed to the second mixer 55, whereby being converted to the second intermediate frequency before being tapped off. The output thereof is fed to the output circuit 56, and then tapped off from the output terminal 57B. In the output circuit 56, a signal tapped off from the second mixer 55 is fed to the first filter 58, where a video carrier of an upper adjacent channel and an audio carrier of a lower channel are attenuated and then tapped off. The output thereof is fed to the first amplifier 59 and amplified, then tapped to the second filter 60, where an audio carrier of the upper adjacent channel and a video carrier of the lower channel are attenuated and then tapped off. Further the output thereof is fed to the second amplifier 61 to be amplified, then tapped off.

In this conventional structure, a trap is provided nearby the received signal bandwidth because of the first filter 58. Therefore, in the system which handles digital and analog signals, when receiving compressed digital signals, original signals cannot be reproduced due to deterioration of a differential phase or differential gain in the receiving signal bandwidth.

DISCLOSURE OF THE PRESENT INVENTION

The present invention aims to provide a CATV converter which can receive both of digital and analog signals, and solve the above problem.

An output circuit of the CATV converter according to the present invention comprises:

(1) a first filter coupled with an output terminal of a second mixer, where a first filter attenuates frequencies approximately equal to an audio carrier of an upper adjacent channel and video carrier of a lower adjacent channel,
(2) a first amplifier coupled with an output terminal of the first filter,
(3) a second filter coupled with an output terminal of an first amplifier, where a second filter attenuates a video carrier of the upper adjacent channel and an audio carrier of the lower adjacent carrier,
(4) a second amplifier disposed between the second filter and the output terminal, and has the following function: when an input signal fed to the input terminal is within a predetermined frequency range, the input and output terminals of the second filter are short-circuited because of a high frequency of the input signal.

According to the above structure, when receiving analog signals, the second filter works to realizes an attenuation characteristic, and when receiving digital signals, the second filter is short-circuited due to a high frequency of the signals so that a passing characteristic in the bandwidth may be flat, whereby providing a CATV converter which can receive digital/analog signals without deterioration.

DETAILED DESCRIPTION OF THE PREFERRED EXEMPLARY EMBODIMENT

Figure 1:
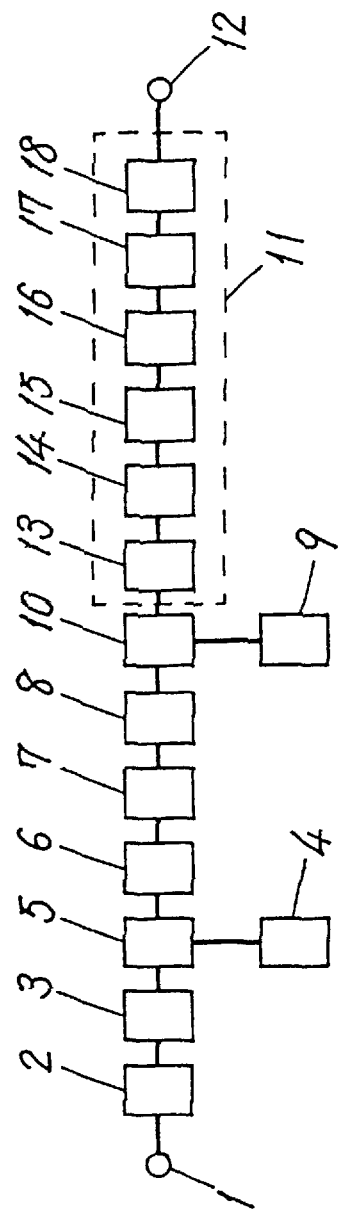
FIG. 1 is a block diagram according to an exemplary embodiment of the present invention.

FIG. 1 is a block diagram of a CATV converter according to an exemplary embodiment. As depicted in FIG. 1, the CATV converter of the present invention comprises:

(1) an input terminal 1,
(2) an input filter 2 coupled with the input terminal 1,
(3) an input amplifier 3 coupled with the output terminal of the input filter 2,
(4) a first local oscillator 4,
(5) a first mixer 5 of which first input terminal is coupled with the output terminal of the input amplifier 3, and the second input terminal is coupled with the output terminal of the first local oscillator 4,
(6) a first intermediate frequency filter 6 coupled with the output terminal of the first mixer 5,
(7) an intermediate frequency amplifier 7 coupled with the output terminal of the intermediate filter 6,
(8) a second intermediate filter 8 coupled with the output terminal of the intermediate frequency amplifier 7,
(9) a second local oscillator 9,
(10) a second mixer 10 of which first input terminal is coupled with the output terminal of the second intermediate frequency filter 8, and the second input terminal is coupled with the output terminal of the second local oscillator 9,

(11) an output circuit 11 coupled with the output terminal of the second mixer 10, and

(12) an output terminal 12 coupled with the output terminal of the output circuit 11, where the output circuit 11 comprises:
  (a) a first filter 13 coupled with the output terminal of he second mixer 10,
  (b) a first amplifier 14 coupled with the output terminal of the first filter 13,
  (c) a second filter 15 coupled with the output terminal of the first amplifier 14,
  (d) a second amplifier 16 coupled with the output terminal of the second filter 15,
  (e) an attenuator 17 coupled with the output terminal of the second amplifier 16, and
  (f) an output filter 18 coupled with the output terminal of the attenuator 17.

Figure 2:
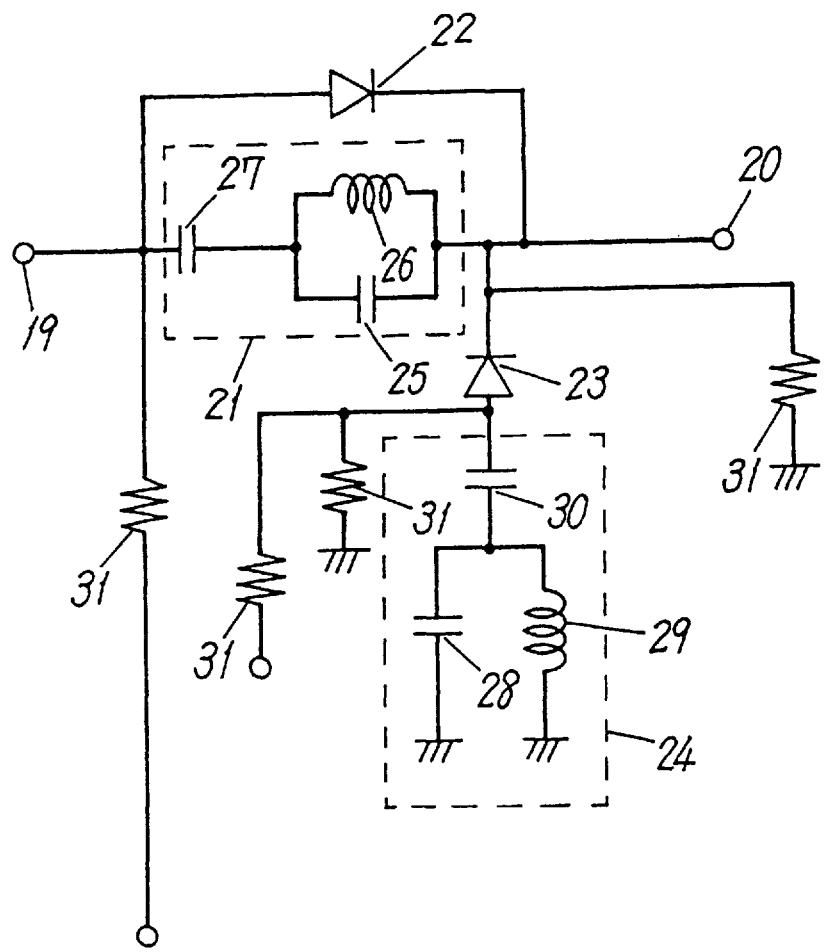
FIG. 2 is a circuit diagram of an output circuit according to a first exemplary embodiment of the present invention.

FIG. 2 is a circuit diagram of the second filter 15. As FIG. 2 depicts, the second filter 15 has the following elements:

(1) a lower trap circuit 21 coupled with each other in series between an input terminal 19 and output terminal 20, (2) a first diode 22 turning the lower trap circuit 21 ON or OFF, (3) a second diode 23, and (4) an upper trap circuit 24 being turned ON or OFF by the second diode 23, where the upper trap circuit 24 comprises:
  (a) a capacitor 28 of 120 pF coupled in parallel with
  (b) an air-core coil 29 of 133 uH and
  (c) a capacitor 30 of 15 pF coupled in series with the above parallel circuit (a) and (b).

The lower trap circuit 21 comprises:
  (d) a capacitor 25 of 180 pF (used as an example of a capacitance) coupled in parallel with
  (e) an air-core coil 26 of 63 uH (used as an example of an inductance), and
  (f) a capacitor 27 of 33 pF coupled in series with the above parallel circuit (d) and (e).

A resistor 31 provides a bias voltage which turns diodes 22 and 23 ON or OFF. The upper trap circuit 24 may be disposed between the input terminal 19 of the lower trap circuit 21 and the grounding.

Figure 3:
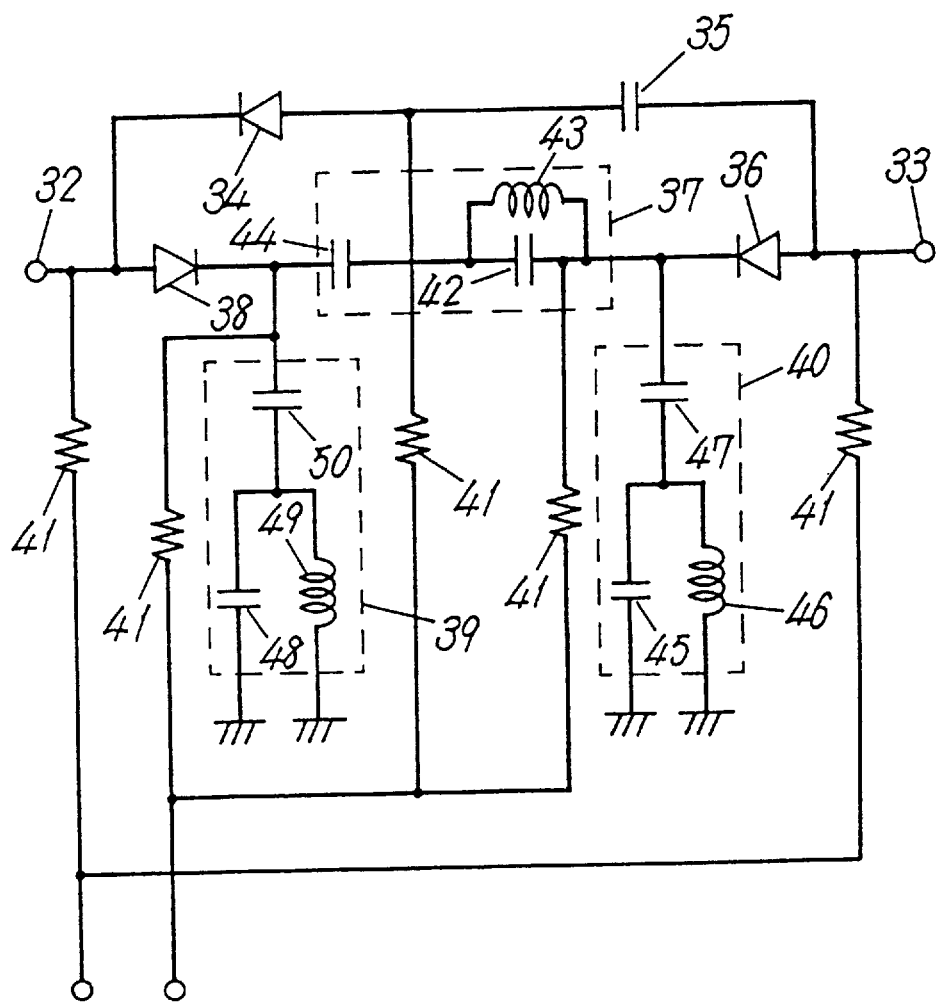
FIG. 3 is a circuit diagram of an output circuit according to a second exemplary embodiment of the present invention.

FIG. 3 depicts also the second filter 15a used in another exemplary embodiment. The second filter 15a comprises the following circuits:

(1) a first diode 34 coupled in series with a capacitor 35 of 2200 pF is disposed between an input terminal 32 and output terminal 33, (2) a third diode 38, a lower trap circuit 37 and a second diode 36 are coupled in parallel with the series circuit (1), (3) a resonant circuit 39 which raises the passband is disposed between the connection of third diode 38 and the lower trap circuit 37 and the grounding, (4) an upper trap circuit 40 is disposed between the junction point of the lower trap circuit 37 and second diode 36 and the grounding, and (5) a resistor 41 provides a bias voltage which turns the diodes 34, 36 and 38 ON or OFF, the lower trap circuit 37 comprises:
  (a) a capacitor 42 of 180 pF coupled in parallel with
  (b) an air-core coil 43 of 63 uH and
  (c) a capacitor 44 of 33 pF coupled in series with the above parallel circuit (a) and (b), the upper trap circuit 40 comprises:
  (d) a capacitor 45 of 120 pF coupled in parallel with
  (e) an air-core coil 46 of 133 uH, and
  (f) a capacitor 47 of 15 pF coupled in series with the above parallel circuit (d) and (e), and the resonant circuit 39 comprises:
  (g) a capacitor 48 of 220 pF coupled in parallel with
  (h) an air-core coil 49 of 59 uH, and
  (i) a capacitor 50 of 2200 pF coupled in series with the above parallel circuit (g) and (h).

The CATV converter of the present invention receives CATV signals (48–1080 MHz) comprising analog and digital signals at the input terminal 1, and the first mixer 5 converts this input signals to the first intermediate frequency (analog video carrier: 1410.75 MHz, digital compressed carrier: 1409 MHz), and then the second mixer 10 converts the first intermediate frequency to the second intermediate frequency (analog video carrier: 45.75 MHz, digital compressed carrier: 44 MHz) before output.

Figure 4:
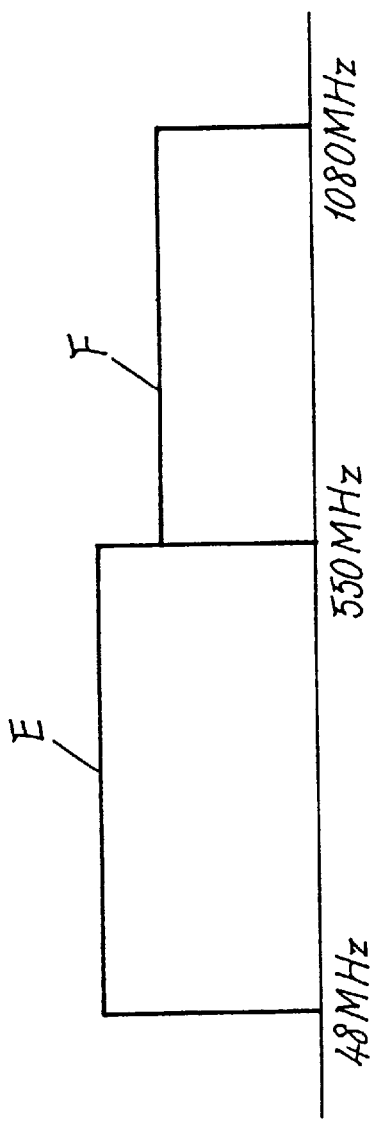
FIG. 4 is a frequency distribution chart of an input signal.
Figure 5:
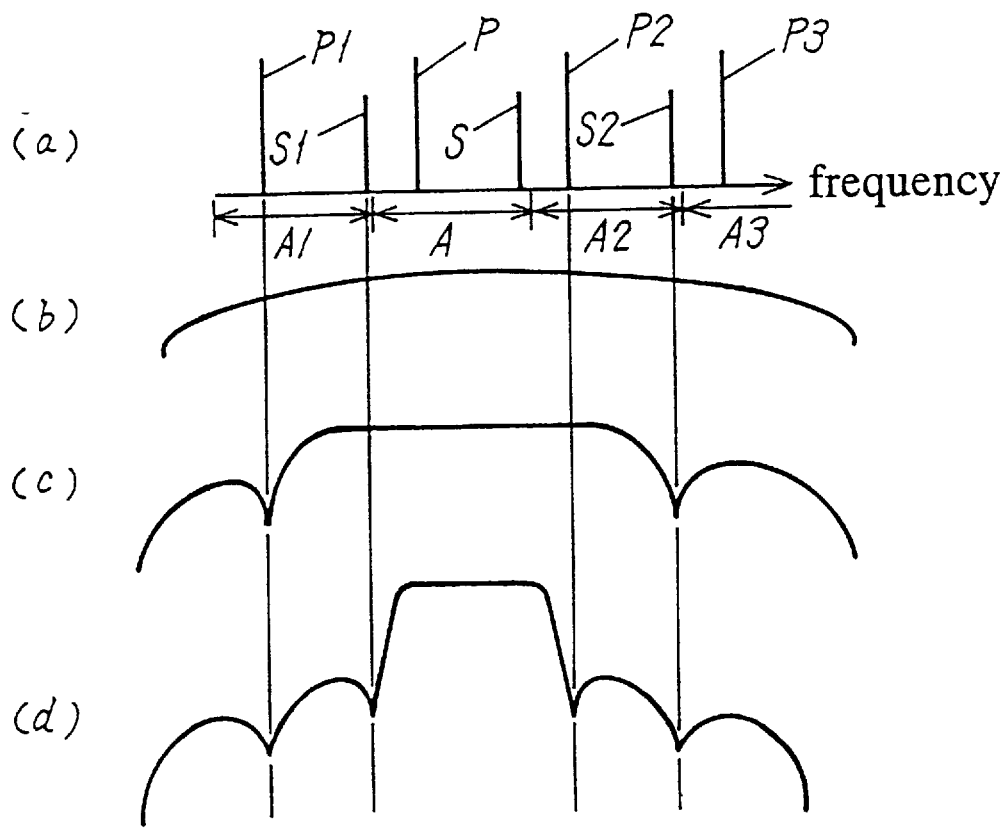
FIG. 5 depicts signals of each part.

As illustrated in FIG. 4, the input signal comprises analog signals within a bandwidth E (48–550 MHz) and compressed digital signals within a bandwidth F (550–1080 MHz). As illustrated in FIG. 5, this analog signal has a bandwidth of 6 MHz for one channel A, and video carrier P has a frequency higher than that of the lower limit of channel A by 1.25 MHz. Audio carrier S has a frequency higher than that of the video carrier P by 4.5 MHz. The level of audio carrier S is normally lower than that of video carrier P by 10–15 dB.

In FIG. 5, symbols represent the following meanings:

A: a signal bandwidth of a desired channel,

A1: a signal bandwidth of a lower channel,

A2: a signal bandwidth of an upper adjacent channel,

A3: a signal bandwidth of an next upper adjacent channel,

P: video carrier,

P1: video carrier of the lower adjacent channel,

P2: video carrier of the upper adjacent channel,

P3: video carrier of the next upper adjacent channel,

S: audio carrier,

S1: audio carrier of the lower adjacent channel, and

S2: audio carrier of the upper adjacent channel

Figure 6:
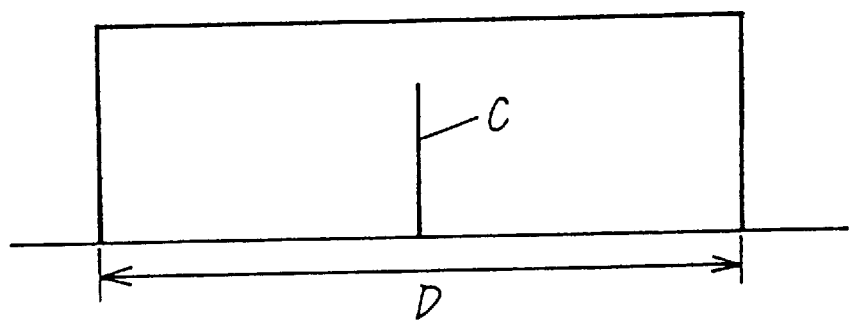
FIG. 6 is a frequency distribution chart of a digital signal.
Figure 7:
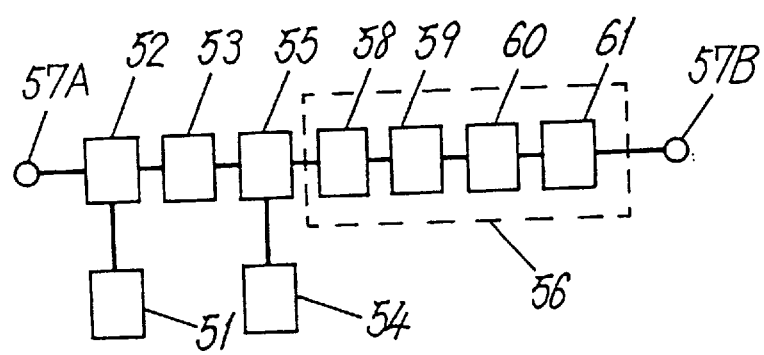
FIG. 7 is a block diagram of a conventional CATV converter.

As illustrated in FIG. 6, the digital signal has a bandwidth of 6 MHz for one channel D, and digital carrier C has a center frequency of the digital signal bandwidth D. Normally the level of this digital carrier C is lower than that of analog video carrier P by 6 dB.

An operation of the above CATV converter is explained here: in FIG. 1, an input signal to the input terminal 1 is fed into the input filter 2, where unnecessary components outside of the input signal bandwidth are removed. Then the input signal is amplified by the input amplifier 3, and fed into the first input terminal of the first mixer 5, where the input signal is mixed with an output of the first local oscillator 4 which oscillates a higher frequency than the input signal by the first intermediate frequency, and the output of the first local oscillator 4 is fed to the second input terminal of the first mixer 5. The mixed signal is then converted to the first intermediate frequency and tapped off. The converted signal is then fed to the first intermediate frequency filter 6 to pass through the first intermediate frequency bandwidth and the other components are attenuated. The first intermediate frequency is amplified in the intermediate amplifier 7, and passed through the second intermediate frequency filter 8 so that the first intermediate frequency bandwidth may pass through and the other components are further attenuated.

The output of the second intermediate frequency filter 8 is fed to the first input terminal of the second mixer 10, where the input signal is mixed with an output of the second local oscillator 9 which oscillates a frequency lower than the first intermediate frequency by the second intermediate frequency, and the output of the second local oscillator 9 is fed to the second input terminal of the second mixer 10. The mixed signal is then converted to the second intermediate frequency and tapped off from the second mixer 10. The converted signal has a waveform shown in FIG. 5(*b*), and passes through the output circuit 11. Finally, the signal is tapped off from the output terminal 12.

The signal converted to the second intermediate frequency and fed into the output circuit 11 is fed into the first amplifier 14 after passing through the first filter 13 where the audio carrier S2 of the upper adjacent channel and the video carrier P1 of the lower adjacent channel are attenuated, and then the signal has a waveform shown in FIG. 5(*c*). The second intermediate frequency amplified in the first amplifier 14 is fed into the second filter 15. At this moment, when an analog signal is fed, the voltage is applied through the bias resistor 31 so that the first diode 22 in FIG. 2 is turned OFF and the second diode 23 in FIG. 2 is turned ON, and the video carrier P2 of the upper adjacent channel in FIG. 5 and the audio carrier S1 of the lower adjacent channel in FIG. 5 are attenuated (at the same time, the audio carrier S2 of the upper adjacent channel is attenuated too.), whereby having a waveform shown in FIG. 5(*d*). Finally, the analog signal is tapped off after passing through the attenuator 17 and the output filter 18. Lien a digital signal is fed instead of the analog signal, the voltage is applied through the bias resistor 31 so that the first diode 22 is turned ON and the second diode 23 is turned OFF, whereby maintaining a waveform shown in FIG. 5(*c*). Finally the digital signal is tapped off after passing through the attenuator 17 and the output filter 18.

The above embodiment proves that ON/OFF operation of the first diode 22 and second diode 23 can switch the characteristics of the output circuit 11.

A second embodiment is explained below: The second filter depicted in FIG. 3 is used instead of the filter 15 shown in FIG. 2 which is used in the previous embodiment. The other elements than the above second filter are the same as used in the previous embodiment. Thus, only the second filter shown in FIG. 3 is explained here:

When an analog signal is fed to, the voltage which turns the first diode 34 OFF and turns the second diode 36 as well as the third diode 38 ON is applied through the bias resistor 41, and the video carrier P2 of the upper adjacent channel in FIG. 5 and the audio carrier S1 of the lower adjacent channel in FIG. 5 are attenuated (at the same time, the audio carrier S2 of the upper adjacent channel is attenuated too.), whereby having a waveform shown in FIG. 5(*d*). Finally, the analog signal is tapped off after passing through the attenuator 17 and the output filter 18.

When a digital signal is fed to, the voltage which turns the first diode 34 ON and turns the second diode 36 as well as the third diode 38 OFF is applied through the bias resistor 41, whereby maintaining the waveform shown in FIG. 5(*c*). Finally the digital signal is tapped off after passing the attenuator 17 and the output filter 18.

The second embodiment proves that the ON/OFF operation of the first diode 34, the second diode 36 and third diode 38 can switch the characteristics of the output circuit.

APPLICABILITY TO INDUSTRIAL USE

The CATV converter of the present invention comprises:
(1) the second mixer,
(2) the first filter coupled with the second mixer, attenuating approximately the same frequency as the audio carrier of the upper adjacent channel as well as approximately the same frequency as the video carrier of the lower adjacent channel,
(3) the first amplifier coupled with the output terminal of the first filter,
(4) the second filter coupled with the output terminal of the first amplifier, attenuating the video carrier of the upper adjacent channel and the audio carrier of the lower adjacent channel,
(5) the second amplifier disposed between the second filter and the output terminal.

When an input signal is within the predetermined frequency range, the input and output terminals of the second filter can be short-circuited or opened by a high frequency of the input signal. Therefore, when an analog signal is fed, the second filter works to gain an attenuation characteristic; when a digital signal is fed, the second filter is short circuited to produce a flat passing characteristic within the bandwidth. As a result, both of an analog signal or a digital signal can be received by the CATV converter of the present invention without deterioration.

1 Input terminal
2 Input filter
3 Input amplifier
4 First local oscillator
5 First mixer
6 First inter-mediate frequency filter
7 Intermediate frequency amplifier
8 Second intermediate filter
9 Second local oscillator
10 Second mixer
11 Output circuit
12 Output terminal
13 First filter
14 First amplifier
15 Second filter
16 Second amplifier
17 Attenuator
18 Output filter
19 Input terminal
20 Output terminal
21 Lower trap circuit
22 First diode
23 Second diode
24 Upper trap circuit
25 Capacitor
26 Air-core coil
27 Capacitor
28 Capacitor
29 Air-core coil
30 Capacitor
31 Bias resistor
32 Input terminal
33 Output terminal
34 First diode
35 Capacitor
36 Second diode
37 Lower trap circuit
38 Third diode
39 Resonant circuit
40 Upper trap circuit
41 Bias resistor
42 Capacitor
43 Air-core coil
44 Capacitor 45 Capacitor
46 Air-core coil
47 Capacitor
48 Capacitor
49 Air-core coil
50 Capacitor
51 First local oscillator
52 First mixer
53 Intermediate frequency filter
54 Second local oscillator
55 Second mixer
56 Output circuit
57A Input terminal
57B Output terminal
58 First filter
59 First amplifier
61 Second amplifier

What is claimed is:

1. A CATV converter comprising:
   (1) an input terminal,
   (2) a first local oscillator,
   (3) a first mixer of which a first terminal receives an input signal tapped off from said input terminal, and of which a second terminal receives an output from said first local oscillator,
   (4) an intermediate frequency filter into which an output from said first mixer is fed,
   (5) a second local oscillator,
   (6) a second mixer of which a first terminal receives an output from said intermediate frequency filter, and of which a second terminal receives an output from said second local oscillator,
   (7) an output circuit coupled with said second mixer, and
   (8) an output terminal coupled with said output circuit, wherein said output circuit comprises:
      (a) a first filter coupled with an output terminal of a second mixer, wherein the first filter attenuates frequencies approximately equal to an audio carrier of an upper adjacent channel and video carrier of a lower adjacent channel,
      (b) a first amplifier coupled with an output terminal of the first filter,
      (c) a second filter coupled with an output terminal of the first amplifier, wherein the second filter attenuates a video carrier of the upper adjacent channel and an audio carrier of the lower adjacent channel, and
      (d) a second amplifier disposed between the second filter and the output terminal coupled with said output circuit, and wherein said output circuit has the following function: the input signal fed into the input terminal can short-circuit input and output terminals of the second filter with a high frequency of the input signal within a predetermined frequency range.

2. A CATV converter comprising:
   (1) an input terminal,
   (2) a first local oscillator,
   (3) a first mixer of which a first terminal receives an input signal tapped off from said input terminal, and of which a second terminal receives an output from said first local oscillator,
   (4) an intermediate frequency filter into which an output from said first mixer is fed,
   (5) a second local oscillator,
   (6) a second mixer of which a first terminal receives an output from said intermediate frequency filter, and of which a second terminal receives an output from said second local oscillator,
   (7) an output circuit coupled with said second mixer, and
   (8) an output terminal coupled with said output circuit, wherein said output circuit comprises:
      (a) a first filter coupled with an output terminal of a second mixer, wherein the first filter attenuates frequencies approximately equal to an audio carrier of an upper adjacent channel and video carrier of a lower adjacent channel,
      (b) a first amplifier coupled with an output terminal of the first filter,
      (c) a second filter coupled with an output terminal of the first amplifier, wherein the second filter attenuates a video carrier of the upper adjacent channel and an audio carrier of the lower adjacent channel, and
      (d) a second amplifier disposed between the second filter and the output terminal coupled with said output circuit, and
   wherein said second filter comprises:
      (e) a lower trap circuit disposed in series between the input and output terminals of said second filter, said lower trap circuit comprising:
         (e1) a first capacitance coupled in parallel with
         (e2) a first inductance, and
         (e3) a second capacitance coupled in series with the parallel circuit (e1) and (e2),
      (f) a first diode coupled in parallel with said lower trap circuit,
      (g) a series circuit of an upper trap circuit and a second diode disposed between one of the input terminal and output terminal of said lower trap circuit and a grounding, and
      (h) the upper trap circuit comprising:
         (h1) a third capacitance coupled in parallel with
         (h2) a second inductance, and
         (h3) a fourth capacitance coupled in series with the parallel circuit (h1) and (h2), and
   wherein, when the input signal fed into said input terminal is within a predetermined frequency range, a signal from a control terminal turns said first diode ON and said second diode OFF.

3. A CATV converter comprising:
   (1) an input terminal,
   (2) a first local oscillator,
   (3) a first mixer of which a first terminal receives an input signal tapped off from said input terminal, and of which a second terminal receives an output from said first local oscillator,
   (4) an intermediate frequency filter into which an output from said first mixer is fed,
   (5) a second local oscillator,
   (6) a second mixer of which a first terminal receives an output from said intermediate frequency filter, and of which a second terminal receives an output from said second local oscillator,
   (7) an output circuit coupled with said second mixer, and
   (8) an output terminal coupled with said output circuit, wherein said output circuit comprises:
      (a) a first filter coupled with an output terminal of a second mixer, wherein the first filter attenuates frequencies approximately equal to an audio carrier of an upper adjacent channel and video carrier of a lower adjacent channel,
      (b) a first amplifier coupled with an output terminal of the first filter, (c) a second filter coupled with an output terminal of the first amplifier, wherein the second filter attenuates a video carrier of the upper adjacent channel and an audio carrier of the lower adjacent channel, and (d) a second amplifier disposed between the second filter and the output terminal coupled with said output circuit, and wherein said second filter comprises:

(e) a lower trap circuit, disposed in series between the input and output terminals of said second filter, said lower trap circuit comprising:
(e1) a first capacitance coupled in parallel with
(e2) a first inductance, and
(e3) a second capacitance coupled in series with the parallel circuit (e1) and (e2), (f) a first diode turning ON or OFF said lower trap circuit, (g) a second diode, (h) an upper trap circuit being turned ON or OFF by said second diode disposed between one of the input and output terminals of said lower trap circuit, said upper trap circuit comprising:
(h1) a third capacitance coupled in parallel with
(h2) a second inductance, and
(h3) a fourth capacitance coupled in series with the parallel circuit (h1) and (h2), (i) a third diode, (j) a resonant circuit coupled with a second terminal of said lower trap circuit, and being turned ON and OFF by said third diode, said resonant circuit comprising:
(j1) a fifth capacitance coupled in parallel with
(j2) a third inductance, and
(j3) a sixth capacitance coupled in series with the parallel circuit (j1) and (j2), and wherein, when the input signal fed into said input terminal is within a predetermined frequency range, a signal from a control terminal turns said first diode ON and turns said second diode as well as said third diode OFF.

* * * * *